United States Patent
Guha et al.

(10) Patent No.: US 7,902,049 B2
(45) Date of Patent: Mar. 8, 2011

(54) METHOD FOR DEPOSITING HIGH-QUALITY MICROCRYSTALLINE SEMICONDUCTOR MATERIALS

(75) Inventors: Subhendu Guha, Bloomfield Hills, MI (US); Chi C. Yang, Troy, MI (US); Baojie Yan, Rochester Hills, MI (US)

(73) Assignee: United Solar Ovonic LLC, Auburn Hills, MI (US)

( * ) Notice: Subject to any disclaimer, the term of this patent is extended or adjusted under 35 U.S.C. 154(b) by 0 days.

(21) Appl. No.: 10/765,435

(22) Filed: Jan. 27, 2004

(65) Prior Publication Data

US 2005/0164474 A1 Jul. 28, 2005

(51) Int. Cl.
*H01L 21/00* (2006.01)

(52) U.S. Cl. ......... 438/485; 438/486; 438/487; 438/482; 438/488; 438/96; 438/97

(58) Field of Classification Search .................... 438/93, 438/97, 478, 485, 479, 488, 487, 96; 427/575
See application file for complete search history.

(56) References Cited

U.S. PATENT DOCUMENTS

| | | | |
|---|---|---|---|
| 4,600,801 A | 7/1986 | Guha et al. | 136/249 |
| 5,786,023 A * | 7/1998 | Maxwell et al. | 427/8 |
| 5,977,476 A | 11/1999 | Guha et al. | 136/249 |
| 6,274,461 B1 * | 8/2001 | Guha et al. | 438/478 |
| 6,368,944 B1 | 4/2002 | Okabe et al. | 438/482 |
| 6,472,248 B2 | 10/2002 | Shiozaki et al. | 438/97 |
| 6,521,883 B2 | 2/2003 | Isomura | 250/214.1 |
| 2003/0036090 A1 * | 2/2003 | Patil et al. | 435/6 |

OTHER PUBLICATIONS

Shah et al.: *Material and Solar Cell Research in Microcrystalline Silicon*; Solar Energy Materials and Solar Cells 78; pp. 469-491 (2003).

* cited by examiner

*Primary Examiner* — Thao X Le
*Assistant Examiner* — Thanh Y Tran
(74) *Attorney, Agent, or Firm* — Gifford, Krass, Sprinkle, Anderson & Citkowski, P.C.

(57) ABSTRACT

A process for the plasma deposition of a layer of a microcrystalline semiconductor material is carried out by energizing a process gas which includes a precursor of the semiconductor material and a diluent with electromagnetic energy so as to create a plasma therefrom. The plasma deposits a layer of the microcrystalline semiconductor material onto the substrate. The concentration of the diluent in the process gas is varied as a function of the thickness of the layer of microcrystalline semiconductor material which has been deposited. Also disclosed is the use of the process for the preparation of an N-I-P type photovoltaic device.

14 Claims, 1 Drawing Sheet

METHOD FOR DEPOSITING HIGH-QUALITY MICROCRYSTALLINE SEMICONDUCTOR MATERIALS

GOVERNMENT INTEREST

This work was supported by the United States Department of Energy under Contract No. ZDJ-2-30630-19.

FIELD OF THE INVENTION

This invention relates generally to semiconductor materials. More specifically, the invention relates to thin-film semiconductor materials. Most specifically, the invention relates to high-quality microcrystalline semiconductor materials, devices made from those materials, and methods for their manufacture.

BACKGROUND OF THE INVENTION

This invention relates generally to thin-film semiconductor materials. Within the context of this disclosure, thin-film semiconductor materials comprise materials which are deposited by building up thin layers on a substrate, typically through a vapor deposition process. Such processes include plasma deposition processes (also referred to as plasma chemical vapor deposition processes), wherein a process gas typically comprised of a semiconductor precursor and a diluent gas is subjected to an electrical field which ionizes the gas so as to create a reactive plasma which decomposes at least some of the components of the process gas and deposits a layer of semiconductor material onto a substrate maintained in, or in close proximity to, the plasma. Non-plasma deposition processes such as non-plasma chemical vapor deposition and evaporation processes may be similarly employed for the preparation of thin-film semiconductor materials.

Thin-film semiconductor materials are generally considered to be disordered semiconductor materials insofar as they are lacking in long-range order and are not single crystalline or polycrystalline materials. Thin-film semiconductor materials may be amorphous materials which manifest only local or intermediate range ordering (although they may include, at times, regions of higher ordering). Thin-film materials also include microcrystalline materials, which are distinguishable from long range ordered materials such as single crystalline materials and polycrystalline materials as well as from other thin-film materials such as amorphous materials.

U.S. Pat. No. 4,600,801 discloses a highly conductive, highly transparent P doped, microcrystalline semiconductor alloy material having a particular utility in N-I-P type photovoltaic devices, and the disclosure thereof is incorporated herein by reference. As specifically disclosed therein, microcrystalline materials are distinguishable from amorphous materials insofar as they exhibit a threshold volume fraction of crystalline inclusions at which substantial changes in key parameters, including electrical conductivity, band gap and absorption constant occur.

The concept of microcrystalline materials exhibiting a threshold volume fraction of crystalline inclusions at which substantial changes in key parameters occur can best be understood with reference to the percolation model of disordered materials. Percolation theory, as applied to microcrystalline materials, analogizes properties such as the electrical conductivity manifested by microcrystalline materials, to the percolation of a fluid through a non-homogeneous, semi-permeable medium such as a gravel bed. Microcrystalline materials are formed of a random network which includes low conductivity, highly disordered regions of materials surrounding randomized, highly ordered crystalline inclusions having high electrical conductivity. Once these crystalline inclusions attain a critical volume fraction of the network (which critical volume will depend, inter alia, upon the size and/or shape and and/or orientation of the inclusions), it becomes a statistical probability that said inclusions are sufficiently interconnected so as to provide a low resistance current path through the network. Therefore, at this critical or threshold volume fraction, the material exhibits a sudden increase in conductivity. This analysis (as described in general terms relative to electrical conductivity herein) is well known to those skilled in solid-state theory and may be similarly applied to describe additional changes in physical properties of microcrystalline materials such as optical gap, absorption constant, etc.

The onset of this critical threshold value for the substantial change in physical properties of microcrystalline materials will depend upon the size, shape and orientation of the particular crystalline inclusions, but is relatively constant for different types of materials. The shape of the crystalline inclusions is critical to the volume fraction necessary to reach the threshold value. There exist one-dimensional, two-dimensional and three-dimensional models which predict the volume fraction of inclusions necessary to reach the threshold value, these models being dependent on the shape of the crystalline inclusions. For instance, in a one-dimensional model (which may be analogized to the flow of charge carriers through a thin wire), the volume fraction of inclusions in the amorphous network must be 100% to reach the threshold value. In the two-dimensional model (which may be viewed as substantially conically shaped inclusions extending through the thickness of the amorphous network), the volume fraction of inclusions in the amorphous network must be about 45% to reach the threshold value. Finally, in the three-dimensional model (which may be viewed as substantially spherical shaped inclusions in a sea of amorphous material), the volume fraction of inclusions need only be about 16-19% to reach the threshold value. Therefore, amorphous materials may incorporate crystalline inclusions without being microcrystalline as the term is defined herein. Likewise, microcrystalline materials may include amorphous regions, consistent with the definition herein.

Microcrystalline semiconductor materials generally have higher electrical conductivities and better stabilities then do corresponding amorphous semiconductor materials. As a consequence, microcrystalline semiconductor materials are finding increasing utility in particular semiconductor applications. For example, in the field of photovoltaics, microcrystalline semiconductor layers are used either alone, or in combination with amorphous semiconductor layers to fabricate a variety of photovoltaic device configurations. For example, U.S. Pat. No. 4,600,801 referred to above discloses P-I-N type photovoltaic devices in which the P layer thereof is fabricated from a microcrystalline alloy of silicon hydrogen and fluorine. A paper entitled: "*Material and Solar Cell Research in Microcrystalline Silicon*", Shah et al., Solar Energy Materials and Solar Cells 78 (2003) 469-491, discloses photovoltaic devices made entirely out of microcrystalline alloys of silicon and hydrogen. U.S. Pat. No. 6,472,248 discloses photovoltaic devices which are comprised of amorphous semiconductor material and stacked microcrystalline layers of semiconductor material having differing morphologies.

As is known in the prior art, and as is recognized in the '248 patent, microcrystalline silicon and its alloys can exist in various morphologies. For example, the material may comprise spherical crystallites in a substantially amorphous matrix; it may comprise more elongated crystals in a matrix; or, it may comprise a columnar structure comprised of relatively long crystals oriented approximately normal to a substrate. The definition of microcrystalline material given above acknowledges and encompasses all of such morphologies.

Plasma deposition processes of the type described above can be implemented under conditions which favor the deposition of amorphous or microcrystalline materials and such deposition conditions are disclosed, for example, in the above-referenced U.S. Pat. No. 4,600,801 which is incorporated herein by reference. It is to be understood that plasma deposition processes may be carried out using a very wide range of electromagnetic energy, including frequencies ranging from audio frequency to radio frequency to very high frequency and up through microwave frequencies; and the present invention can be utilized with all of such frequencies.

The prior art has recognized that the optimum microcrystalline silicon alloy layers for photovoltaic devices are deposited under deposition conditions which are close to the amorphous/microcrystalline threshold. In this regard see, for example, Shah et al. op cit. Shah has likewise recognized that microcrystalline silicon having a columnar or other large grain structure is generally undesirable for the fabrication of photovoltaic devices and has stated that, in a plasma deposition process, the use of process gases which have high levels of hydrogen dilution will cause the growth of large grains. The prior art also recognized that a plasma deposited amorphous semiconductor material will tend to become more ordered as its thickness increases. This teaching is found in U.S. Pat. No. 6,274,461, the disclosure of which is incorporated herein by reference.

In the course of preparing photovoltaic cells from microcrystalline materials, the inventors hereof found that cell performance, as measured by one or both of open circuit voltage ($V_{oc}$) and fill factor (FF), decreases rapidly as thickness of the device was increased. The rate of decrease in performance as a function of thickness was too great to be attributable to the increased distance through which charge carriers had to travel, which led the inventors hereof to surmise that the material quality of the deposited microcrystalline semiconductor must be deteriorating as its thickness increases.

Table 1 summarizes data from a series of experiments in which six N-I-P type photovoltaic devices were prepared by a plasma activated glow discharge deposition process carried out utilizing very high frequency energy of 70 MHz. Each cell comprised a body of intrinsic microcrystalline silicon-hydrogen alloy material interposed between relatively thin P and N doped layers of microcrystalline silicon-hydrogen alloy material. As will be seen from Table 1, the thickness of the intrinsic layer varied from 335 nm in sample 1 to 1980 nm in sample 6.

Performance parameters for each of the cells were measured under AM-1.5 illumination. These parameters include the figure of merit Q measured in terms of in $A/cm^2$, open circuit voltage ($V_{oc}$), fill factor (FF) and maximum power ($P_{max}$) measured in terms of $mW/cm^2$. Fill factor is a good measure of material quality of a semiconductor material used in a photovoltaic device; and as will be seen (disregarding the relatively thin cell of sample 1), fill factor decreases as the thickness of the intrinsic layer increases. Likewise, open circuit voltage of the cell also drops as the intrinsic layer becomes thicker, and this suggests that the grain size of the material forming the intrinsic layer is increasing as the layer thickness increases. While not wishing to be bound by speculation, the inventors hereof have postulated that the degree of ordering of the microcrystalline semiconductor material is increasing as the thickness of the deposit increases. This leads to the formation of undesirable large-size grains of semiconductor material.

TABLE 1

| Sample No. | Thickness (nm) | Q (mA/cm$^2$) | $V_{oc}$ (V) | FF | $P_{max}$ (mW/cm$^2$) |
|---|---|---|---|---|---|
| 1 | 335 | 9.45 | 0.47 | 0.651 | 2.89 |
| 2 | 470 | 10.98 | 0.466 | 0.672 | 3.44 |
| 3 | 720 | 12.99 | 0.439 | 0.64 | 3.65 |
| 4 | 1040 | 14.8 | 0.434 | 0.621 | 3.99 |
| 5 | 1305 | 16.51 | 0.414 | 0.578 | 3.95 |
| 6 | 1980 | 17.87 | 0.393 | 0.510 | 3.58 |

Having identified this problem, the inventors hereof recognize that there is a need for some method or means for moderating the grain size of microcrystalline semiconductor materials so as to prevent the undesirable growth of large grains in the plasma deposition of microcrystalline semiconductor materials.

Owing to the fact that microcrystalline group IV semiconductor materials have an indirect band gap, their optical absorption coefficients are much lower than those of corresponding amorphous semiconductor materials. Hence, microcrystalline semiconductor layers incorporated in photovoltaic cells, electrophotographic receptors and other photoresponsive devices must be made much thicker than corresponding amorphous layers used in analogous devices. For this reason, the fact that the material quality of such microcrystalline semiconductor layers decreases with increasing thickness is a very serious limitation on the use of such layers, and there is a significant need for preventing this decrease in material quality.

As will be explained in greater detail hereinbelow, the present invention recognizes that by profiling the dilution of a process gas employed for the plasma deposition of a semiconductor material, the morphology of a microcrystalline layer may be advantageously controlled.

BRIEF DESCRIPTION OF THE INVENTION

There is disclosed herein a process for the plasma deposition of a layer of microcrystalline semiconductor material. In the process, a process gas which includes a precursor of the semiconductor material and a diluent is energized with electromagnetic energy so as to create a plasma therefrom. The plasma deposits a layer of the microcrystalline semiconductor material onto a substrate. In accord with the present invention, the concentration of the diluent in the process gas is varied as a function of the thickness of the layer of microcrystalline semiconductor material which has been deposited. In specific embodiments, the concentration of the diluent gas is decreased as the thickness of the layer increases. In some embodiments the concentration is varied in a continuous manner, either linearly or exponentially, while in other embodiments the concentration may be varied in a stepwise manner.

In specific embodiments, the diluent is one or more of hydrogen, deuterium, or a halogen. In one group of embodiments, the microcrystalline semiconductor material includes a group IV element, as for example silicon or germanium.

Also disclosed herein is a method for manufacturing an N-I-P type photovoltaic device having an intrinsic layer prepared according to the method of the present invention.

DETAILED DESCRIPTION OF THE INVENTION

Figure 1:
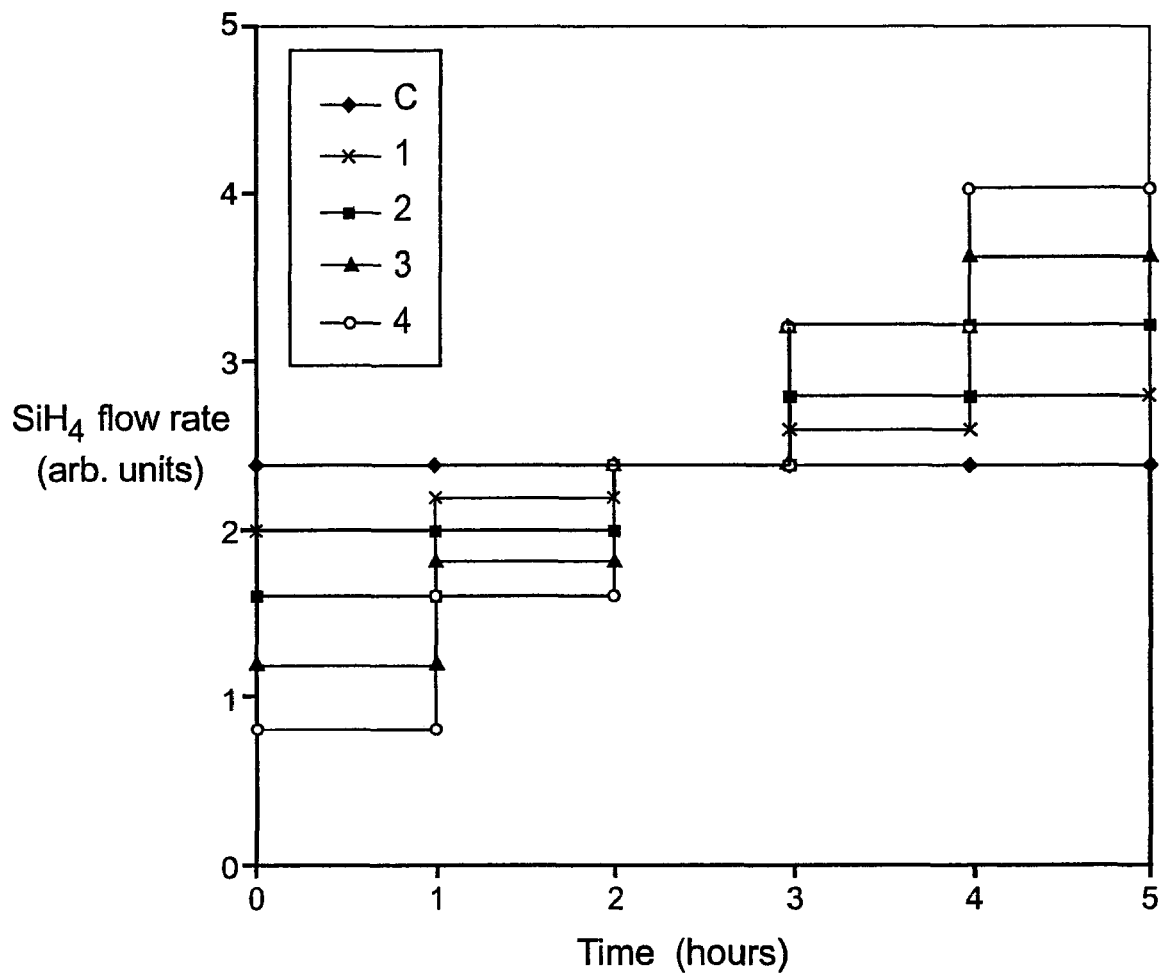
FIG. 1 is a graphic illustration of the stepwise profiling of the concentration of a diluent in a process gas used for the preparation of a series of photovoltaic devices.

In accord with the present invention it has been found that under certain deposition conditions the degree of order of thin-film semiconductor materials varies as a function of the thickness of the layer. That is to say that in the deposition of microcrystalline semiconductor materials the degree of ordering of the material will increase as the deposition proceeds, so that the material will tend to be more crystalline. For example, an initially deposited portion of a layer of microcrystalline material will be comprised of very small randomly oriented crystallites, while later deposited portions of that layer will have a columnar morphology. As recognized in the art, such columnar material is generally unsuitable for use in photovoltaic devices since grain boundaries between the columns create shunting and short circuit paths and allow for the introduction of oxygen and other contaminants which can degrade the semiconductor material. Therefore, the present invention recognizes that in prior art deposition processes, the material quality of the plasma deposited semiconductor alloy material intended for use in a photovoltaic device will decline as the deposition process proceeds.

While applicants do not wish to be bound by speculation, it is theorized that the ordering in the body of the thin-film semiconductor materials varies as a result of a templating effect. In a templating effect a freshly deposited surface provides a template which supports and fosters growth of subsequent layers of semiconductor material thereupon. The ordering of the subsequently deposited layers is generally higher than that of the surface which forms the template since subsequently depositing layers will preferentially align with and be guided in confirmation with the more ordered portions of the templating layer.

In accord with the present invention, it has been found that the material quality of plasma deposited microcrystalline semiconductor materials may be controlled by controlling the composition of the process gas used for the preparation of such materials. More specifically, it has been found that the tendency of a plasma deposited microcrystalline material to become more ordered, and hence have a larger grain size, may be suppressed if the composition of the process gas used for the preparation of the semiconductor material is controlled as a function of the increasing thickness of the layer.

In a typical plasma deposition process, a semiconductor material is prepared from a process gas which includes a precursor of the semiconductor material therein. For example, if a silicon alloy material is being prepared, the process gas may include one or more of $SiH_4$, $Si_2H_6$, $SiF_4$ or the like. In those instances where a germanium-based semiconductor material is being prepared, the process gas may include $GeH_4$ and the like. Mixed silicon-germanium alloy materials may be prepared from mixtures of these gases. In the deposition process, electromagnetic energy in the form of radiofrequency energy, microwave energy, or DC energy ionizes the process gas so as to form a plasma which deposits a semiconductor alloy material onto a substrate, which is typically heated, and which is maintained in proximity to the plasma. As is known in the art, it is typical to include a diluent gas in the process gas mixture. Hydrogen is a very typical diluent gas used in preparation of group IV semiconductor alloy materials. Deuterium and halogens, particularly fluorine, are also used as diluent gases in deposition processes of this type.

In accord with the present invention, it has been found that the quality of a plasma deposited microcrystalline semiconductor alloy material can be controlled by profiling the concentration of a diluent gas in a process gas used for the plasma deposition of that material, as a function of the thickness of the depositing layer. Specifically, it has been found that the growth of undesirable large size grains in a body of depositing microcrystalline semiconductor alloy material can be suppressed by decreasing the concentration of the diluent gas as a function of increasing layer thickness.

The concentration of the diluent gas can be varied by either changing the amount of diluent gas fed into a process gas stream or by changing the amount of semiconductor precursor material in the process gas stream. The profiling of the diluent composition may be carried out in a stepwise manner wherein the concentration is varied through several discrete levels as the layer thickness increases. Alternatively, the diluent gas composition may be varied on a continuous basis either linearly or in an exponential manner.

In general, the concentration of the diluent gas will be decreased as the layer thickness increases, since this will tend to retard to the growth of large size crystallites in the microcrystalline material. However, in some instances, there may be some particular reason for including larger size crystallites in part of the thickness of a layer of microcrystalline material, and the present invention may be adapted for this purpose by implementing it in a mode wherein the concentration of the diluent gas is increased as the layer thickness increases.

Principles of the present invention were demonstrated in a first experimental series wherein five substantially identical microcrystalline N-I-P type photovoltaic devices were prepared from a silicon-hydrogen semiconductor material using deposition processes in which the concentration of a hydrogen diluent gas was varied in a stepwise manner. Each photovoltaic device comprised an approximately two micron thick body of intrinsic microcrystalline silicon-hydrogen semiconductor alloy material interposed between relatively thin P doped and N doped layers of microcrystalline silicon-hydrogen alloy material. The cells were deposited using a modified very high frequency (MVHF) plasma deposition process on stainless steel substrates having a silver/ZnO back reflector thereatop, as is known in the art. The two micron thickness for the intrinsic layer was selected since, as is shown by the data in Table 1 hereinabove, significant problems of material quality have been encountered in microcrystalline layers of this thickness in the past.

In the experimental series, the amount of hydrogen diluent gas in the process gas stream was maintained at a constant flow rate while the amount of $SiH_4$ was increased in a series of steps so as to effectively produce a decreasing profile of diluent gas concentration as a function of increasing intrinsic layer thickness.

Referring now to FIG. 1, there is shown a graphic depiction of the profiling of the process gas composition during the course of a five-hour deposition of the intrinsic layer for the five different samples of the experimental series. As shown in FIG. 1, sample C was a control sample, and the concentration of the process gas was maintained constant throughout the entire deposition. In sample 1, the concentration of the process gas was varied slightly throughout the deposition process. As is shown in FIG. 1, arbitrary units relating to flow, and hence concentration of the $SiH_4$, are depicted. During the deposition of samples 2-4, the process gas composition was varied to an increasingly greater degree. In all instances, the average process gas composition was the same.

The performance characteristics of the thus-prepared photovoltaic devices were all measured, and the results of these measurements are set forth in Table 2 hereinbelow.

TABLE 2

| Sample No. | SiH$_4$ flow increase (arb. units) | Q (mA/cm$^2$) AM 1.5 | Q (mA/cm$^2$) >610 nm | $V_{oc}$ (V) | FF AM 1.5 | FF Blue | FF Red | $P_{max}$ (mW/cm$^2$) |
|---|---|---|---|---|---|---|---|---|
| C | Flat | 21.35 | 10.72 | 0.408 | 0.537 | 0.639 | 0.638 | 4.68 |
| 1 | 1 | 22.03 | 11.42 | 0.411 | 0.545 | 0.651 | 0.634 | 4.93 |
| 2 | 2 | 23.02 | 12.42 | 0.413 | 0.520 | 0.620 | 0.635 | 4.94 |
| 3 | 3 | 24.03 | 13.54 | 0.413 | 0.436 | 0.560 | 0.591 | 4.33 |
| 4 | 4 | 20.84 | 10.31 | 0.437 | 0.391 | 0.607 | 0.515 | 3.56 |

Shown in Table 2 is the figure of merit Q, in terms of mA/cm$^2$ for each cell, as measured under AM 1.5 illumination and at long wavelength illumination of greater than 610 nm. Also set forth is the open circuit voltage ($V_{oc}$) for each cell as well as the fill factor (FF) as measured under AM 1.5 illumination, blue illumination and red illumination. Also set forth is the maximum power ($P_{max}$) for each of the cells in terms of mW/cm$^2$. As will be seen from the foregoing, profiling the hydrogen dilution significantly alters the performance characteristics of the cell. In general, it has been found that profiling the hydrogen dilution at a rate of two units per step made the overall best photovoltaic device. Profiling with three units per step did show a higher Q value, but the overall fill factor of this device is somewhat decreased as compared to the two unit ramp of sample 2, and this appears to be due to the fact that the semiconductor comprises a mixed phase material having a high concentration of amorphous component near the P-I interface region of the device. When the profiling is at four units per step as shown for sample 4, the cell performance became very poor due to the further increase of the amorphous component near the P-I interface region. This data demonstrates that by properly profiling the hydrogen dilution of the process gas overall cell performance, particularly in terms of short circuit current, can be maximized for these microcrystalline semiconductor devices. This data suggests that the deterioration of cell performance for thick cells is due to the increase of the microcrystalline volume fraction which may be associated with an increase of microvoid density.

A second experimental series was carried out illustrating the effects of continuously profiling the concentration of a hydrogen diluent gas during the deposition of the intrinsic layer of a microcrystalline photovoltaic device. In this experimental series, a first and a second photovoltaic device of an N-I-P configuration comprising an approximately two micron thick body of intrinsic, microcrystalline silicon-hydrogen semiconductor alloy material interposed between relatively thin P doped and N doped layers of microcrystalline silicon-hydrogen alloy material were prepared using a radio frequency (13.56 MHz) plasma deposition process. The process gas comprised disilane (Si$_2$H$_6$) and a hydrogen diluent. Deposition pressure was maintained at 1.8 torr and the substrate temperature was 275° C. In a first experimental run, the flow rate of the hydrogen diluent gas was maintained at a constant rate of 140 standard cubic centimeters per minute (sccm), and the flow rate of the Si$_2$H$_6$ was maintained at 0.4 sccm. This non-profile deposition process provided a baseline cell.

A second cell was prepared under generally similar pressure and temperature conditions, except that the concentration of hydrogen diluent in the process gas was continuously varied during the deposition process. In this deposition, the flow rate of the Si$_2$H$_6$ was maintained at a constant level of 0.4 sccm while the flow rate of the hydrogen was varied throughout the deposition from an initial high rate of 140 sccm to a final rate of 70 sccm so that the hydrogen concentration in the process gas decreased as a function of increasing thickness of the intrinsic layer.

The open circuit voltage, short circuit current density, fill factor and efficiency of the two cells thus prepared were measured, and this data is summarized in Table 3 hereinbelow.

TABLE 3

| Dilution | $V_{oc}$ (V) | $J_{sc}$ (mA/cm$^2$) | Fill Factor | Efficiency |
|---|---|---|---|---|
| Constant | 0.488 | 22.15 | 0.599 | 6.5 |
| Profiled | 0.490 | 24.63 | 0.641 | 7.7 |

As will be seen, the performance characteristics of the profiled cell are superior to those of the baseline, constant concentration cell. As will be seen from the fill factor, the overall material quality of the material deposited in accord with the present invention is superior to that of the prior art constant concentration process. This is reflected in increased open circuit voltage, increased short circuit current density and better overall efficiency for the profiled cell.

It should also be noted that while this experimental series describes the invention with regard to photovoltaic devices, other photoresponsive semiconductor devices such as electrophotographic receptors can also be fabricated utilizing the methodology disclosed herein. Other parameters of the deposition process such as process gas pressure, frequency of the electromagnetic energy, intensity of the electromagnetic energy, substrate temperature and the like will also influence the microcrystalline nature of the layer, and these parameters may also be controlled so as to further modify the nature of the microcrystalline material.

In accord with the present invention, it has also been found that the degree of ordering of a microcrystalline semiconductor alloy will vary as the ratio of the components of the process gas varies. In the case where alloys such as silicon-germanium alloys are being prepared by a plasma deposition process, the process gas will typically comprise a mixture of a silicon-containing gas such as SiH$_4$, SiF$_4$, Si$_2$H$_6$ and the like, along with a germanium-containing gas such as GeH$_4$. In such instance, the degree of ordering will vary as the ratio of silicon to germanium varies in the process gas. In those instances where structures comprised of graded composition layers are being prepared, the process gas (composition will be changed during the course of the deposition, and the degree of ordering will vary both as a function of layer thickness and composition, and the diluent profile should be controlled accordingly.

While the present invention has been described with reference to the deposition of microcrystalline layers, it is to be understood that the principles may be extended to processes for the deposition of layers which are of varying morphology. Through the use of the present invention, high-quality semiconductor materials having varying degrees of order throughout their thickness may be prepared. For example, through the use of the present invention, materials which progress from amorphous to microcrystalline may be prepared as may be materials which progress from microcrystalline to highly crystalline. All of such embodiments are within the scope of the present invention, and in view of the teaching presented herein, yet other modifications and variations of the invention will be apparent to those of skill in the art.

The foregoing has described the present invention with reference to the preparation of microcrystalline semiconductor materials comprised of silicon, germanium and silicon-germanium, which may be alloyed with other elements including hydrogen and halogens. However, the principles of this invention may be readily extended t) other group IV semiconductor materials, as well as to other types of semiconductors. The foregoing is illustrative of particular aspects of the present invention, but is not meant to be a limitation upon the practice thereof. It is the following claims, including all equivalents, which define the scope of the invention.

We claim:

1. A method for the plasma deposition of a layer of a microcrystalline semiconductor material, said method comprising the steps of:
   providing a deposition chamber;
   providing a process gas mixture which includes a precursor of a semiconductor material and a concentration of a diluent;
   disposing a substrate in the deposition chamber;
   introducing the process gas into the deposition chamber;
   energizing the process gas in the chamber with electromagnetic energy so as to create a plasma therefrom which decomposes at least some of the components of the process gas so as to deposit a layer of said semiconductor material onto the substrate;
   controlling at least one deposition parameter of said deposition process so that the layer of semiconductor material which is deposited onto the substrate in said deposition process is microcrystalline, and is deposited under a set of deposition parameters which are near, but above, the amorphous/microcrystalline threshold, said at least one parameter being selected from the group consisting of: the composition of the process gas; the pressure of the process gas; the power density of the electromagnetic energy; the frequency of the electromagnetic energy; and the temperature of the substrate; and
   varying the concentration of said diluent in said process gas as a function of the thickness of the layer of microcrystalline semiconductor material which has been deposited onto said substrate so as to maintain said set of deposition parameters near, but above said amorphous/microcrystalline threshold and thereby advantageously control the morphology of the microcrystalline material.

2. The process of claim 1, wherein the concentration of said diluent is decreased as the thickness of said layer increases.

3. The process of claim 1, wherein the concentration of said diluent is varied in a stepwise manner as the thickness of said layer increases.

4. The process of claim 1, wherein the concentration of said diluent is varied as a continuous function of the thickness of the layer.

5. The process of claim 1, wherein said microcrystalline semiconductor material includes a group IV element.

6. The process of claim 1, wherein said process gas comprises a member selected from the group consisting of $SiH_4$, $Si_2H_6$, $GeH_4$, $SiF_4$, $GeF_4$ or combinations thereof.

7. The process of claim 1, wherein said diluent is selected from the group consisting of hydrogen, deuterium, a halogen or combinations thereof.

8. The process of claim 1, wherein said diluent comprises hydrogen.

9. The process of claim 1, wherein said electromagnetic energy is microwave energy.

10. The process of claim 1, wherein said electromagnetic energy is radiofrequency energy.

11. The method of claim 1, wherein the step of varying the concentration of the diluent in the process gas comprises changing the amount of the diluent in said process gas.

12. The method of claim 1, wherein the step of varying the concentration of the diluent in the process gas comprises changing the amount of the semiconductor precursor in the process gas.

13. The process of claim 1, including the further step of varying at least one of said deposition parameters as a function of the thickness of the layer of microcrystalline semiconductor material which has been deposited.

14. The process of claim 1, wherein said semiconductor material includes silicon and germanium therein and wherein said process gas includes a silicon-containing compound, a germanium-containing compound, and a diluent selected from the group consisting of hydrogen, deuterium or combinations thereof, and wherein the ratio of said silicon-containing compound to said germanium-containing compound is varied while said semiconductor material is being deposited so that the silicon/germanium ratio of said layer of semiconductor material varies as a function of layer thickness; and wherein the concentration of said diluent gas in the process gas is increased as the ratio of said germanium-containing compound to said silicon-containing compound therein increases.

* * * * *